(12) United States Patent
Sutardja et al.

(10) Patent No.: US 8,873,309 B2
(45) Date of Patent: Oct. 28, 2014

(54) APPARATUS AND METHOD FOR REPAIRING RESISTIVE MEMORIES AND INCREASING OVERALL READ SENSITIVITY OF SENSE AMPLIFIERS

(71) Applicant: Marvell World Trade Ltd., St. Michael (BB)

(72) Inventors: Pantas Sutardja, Los Galos, CA (US); Albert Wu, Palo Alto, CA (US); Runzi Chang, San Jose, CA (US); Winston Lee, Palo Alto, CA (US); Peter Lee, Pleasanton, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/045,230

(22) Filed: Oct. 3, 2013

(65) Prior Publication Data

US 2014/0104924 A1    Apr. 17, 2014

Related U.S. Application Data

(60) Provisional application No. 61/713,899, filed on Oct. 15, 2012.

(51) Int. Cl.
*G11C 16/04* (2006.01)
*G11C 29/02* (2006.01)
*G11C 7/06* (2006.01)
*G11C 13/00* (2006.01)

(52) U.S. Cl.
CPC .............. *G11C 7/065* (2013.01); *G11C 29/026* (2013.01); *G11C 13/0004* (2013.01)
USPC .................. 365/189.05; 365/189.02; 365/205

(58) Field of Classification Search
USPC ........................ 365/189.05, 189.02, 205, 207
See application file for complete search history.

(56) References Cited

U.S. PATENT DOCUMENTS

| 5,880,996 A | 3/1999 | Roohparvar |
| 7,672,173 B2 * | 3/2010 | Ooishi et al. ............. 365/189.05 |
| 2010/0054042 A1 | 3/2010 | Miki |

OTHER PUBLICATIONS

PCT International Search Report and Written Opinion of the International Searching Authority dated Feb. 19, 2014.

\* cited by examiner

*Primary Examiner* — David Lam

(57) ABSTRACT

A memory includes a module and a demultiplexer. The module is configured to monitor outputs of sense amplifiers. Each of the outputs of the sense amplifiers is configured to be in a first state or a second state. The module is configured to determine that two or more of the outputs of the sense amplifiers are in a same state. The same state is the first state or the second state. The module is configured to output the state of the two or more outputs of the sense amplifiers. The demultiplexer is configured to provide the state of the two or more outputs of the sense amplifiers to a latch.

22 Claims, 4 Drawing Sheets

APPARATUS AND METHOD FOR REPAIRING RESISTIVE MEMORIES AND INCREASING OVERALL READ SENSITIVITY OF SENSE AMPLIFIERS

CROSS-REFERENCE TO RELATED APPLICATIONS

This application claims the benefit of U.S. Provisional Application No. 61/713,899, filed on Oct. 15, 2012. The entire disclosure of the application referenced above is incorporated herein by reference.

FIELD

The present disclosure relates to nonvolatile memory, and more particularly to sensitivity of sense amplifiers of random access memory having memory cells with different resistive states.

BACKGROUND

A nonvolatile memory can include an array of memory cells. Each of the memory cells can have multiple resistive states. Certain nonvolatile memories (referred to herein as "resistive memories"), such as phase change random access memory (PRAM), resistive random access memory (RRAM), and magnetic random access memory (MRAM), include memory cells with respective resistances. Each of the resistances changes based on the state of the corresponding memory cell. For example, a memory cell can have a first (or low) resistive state when storing a '0' and a second (or high) resistive state when storing a '1'.

As a first example, in order to determine a resistive state of a memory cell, a voltage can be applied across the resistance of the memory cell. Current through the resistance may then be detected and is indicative of the resistive state. Based on the detected current, the resistive state of the memory cell is determined. As another example, current can be supplied to the resistance of the memory cell. A voltage across the resistance can then be detected and is indicative of the resistive state. The resistive state of the memory cell can then be determined based on the detected voltage.

Sense amplifiers are used to detect voltages across and/or currents through resistances of memory cells. Sense amplifiers have manufacturing variations and as a result exhibit respective random offset voltage variations. An offset voltage of a sense amplifier refers to differences in voltages of transistors in the sense amplifier. An offset voltage can also change and/or become larger over time and/or cycled use of a sense amplifier.

The larger an offset voltage of a sense amplifier, the lower the overall sensitivity of the sense amplifier to changes in a resistance of a memory cell. A sense amplifier with an offset voltage that is greater than a predetermined threshold can provide an output error. For example, a sense amplifier with an offset voltage that is greater than the predetermined threshold may provide a '1' when a state of a corresponding resistance of a memory cell is actually indicative of a '0' or vice versa. A sense amplifier with an offset voltage that is greater than the predetermined threshold may be referred to as a failed sense amplifier. The output of a failed sense amplifier may be referred to as a failure.

SUMMARY

A memory is provided and includes a module and a demultiplexer. The module is configured to monitor outputs of sense amplifiers. Each of the outputs of the sense amplifiers is configured to be in a first state or a second state. The module is configured to determine that two or more of the outputs of the sense amplifiers are in a same state. The same state is the first state or the second state. The module is configured to output the state of the two or more outputs of the sense amplifiers. The demultiplexer is configured to provide the state of the two or more outputs of the sense amplifiers to a latch.

In other features, the module is configured to determine that a majority of the outputs of the sense amplifiers is in the same state. The demultiplexer is configured to provide the same state of the majority of the outputs of the sense amplifiers to the latch.

In other features, the memory further includes an array of memory cells, multiplexers, and the sense amplifiers. The array of memory cells includes bit lines. Each of the multiplexers is configured to receive outputs from two or more of the bit lines. The sense amplifiers are configured to amplify respective outputs of the multiplexers.

In other features, the memory further includes a second module configured to generate one or more selection signals. The multiplexers are configured to select the bit lines based on the one or more selection signals. The demultiplexer is configured to, based on the one or more selection signals, select the latch from multiple latches, and provide the state of the outputs of the plurality of sense amplifiers to the selected latch.

In other features, the module includes logic gates configured to receive a respective one of the outputs of the sense amplifiers. An output multiplexer is configured to, based on the outputs of the sense amplifiers, select an output of the logic gates.

In other features, the memory further includes a second module configured to generate one or more control signals. Each of the sense amplifiers is configured to, based on the one or more control signals, output an amplified version of the respective output of the multiplexers.

In other features, voltages across or currents through the memory cells are indicative of resistive states of resistances of the memory cells. Each of the resistances is configured to be in the first state or the second state.

In other features, an integrated circuit is provided and includes two or more of the memory. The array of memory cells includes at least one of phase-change random access memory cells, resistive random access memory cells, and magnetic random access memory cells.

In other features, a method is provided and includes: monitoring outputs of sense amplifiers, where each of the outputs of the sense amplifiers is configured to be in a first state or a second state; determining that two or more of the outputs of the plurality of sense amplifiers are in a same state, wherein the same state is the first state or the second state; outputting the state of the two or more of the outputs of the sense amplifiers; and providing the state of the two or more of the outputs of the sense amplifiers to a latch.

In other features, the method further includes: determining that a majority of the outputs of the sense amplifiers is in the same state; and providing the same state of the majority of the outputs of the sense amplifiers to the latch.

In other features, the method further includes: receiving at each of multiple multiplexers outputs from two or more bit lines of an array of memory cells; and amplifying via the sense amplifiers a respective output of the multiplexers.

In other features, the method further includes: generating one or more selection signals; based on the one or more selection signals, selecting via the multiplexers the bit lines;

based on the one or more selection signals, selecting the latch from multiple latches; and providing the state of the two or more of the outputs of the sense amplifiers to the selected latch.

In other features, the method further includes: receiving at logic gates a respective one of the outputs of the sense amplifiers; and based on the outputs of the sense amplifiers, select an output of the logic gates.

In other features, the method further includes: generating one or more control signals; and based on the one or more control signals, outputting from each of the sense amplifiers an amplified version of the respective output of the multiplexers.

In other features, voltages across or currents through the memory cells are indicative of resistive states of resistances of the memory cells; and each of the resistances is configured to be in the first state or the second state.

In other features, the array of memory cells includes phase-change random access memory cells, resistive random access memory cells, and magnetic random access memory cells.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

The following disclosed implementations improve overall sensitivity associated with sense amplifiers while providing techniques to repair resistive memories having one or more failed sense amplifiers. Effective offset voltages of multiple sense amplifiers are reduced, which increase the overall sensitivity of the sense amplifiers.

Figure 1:
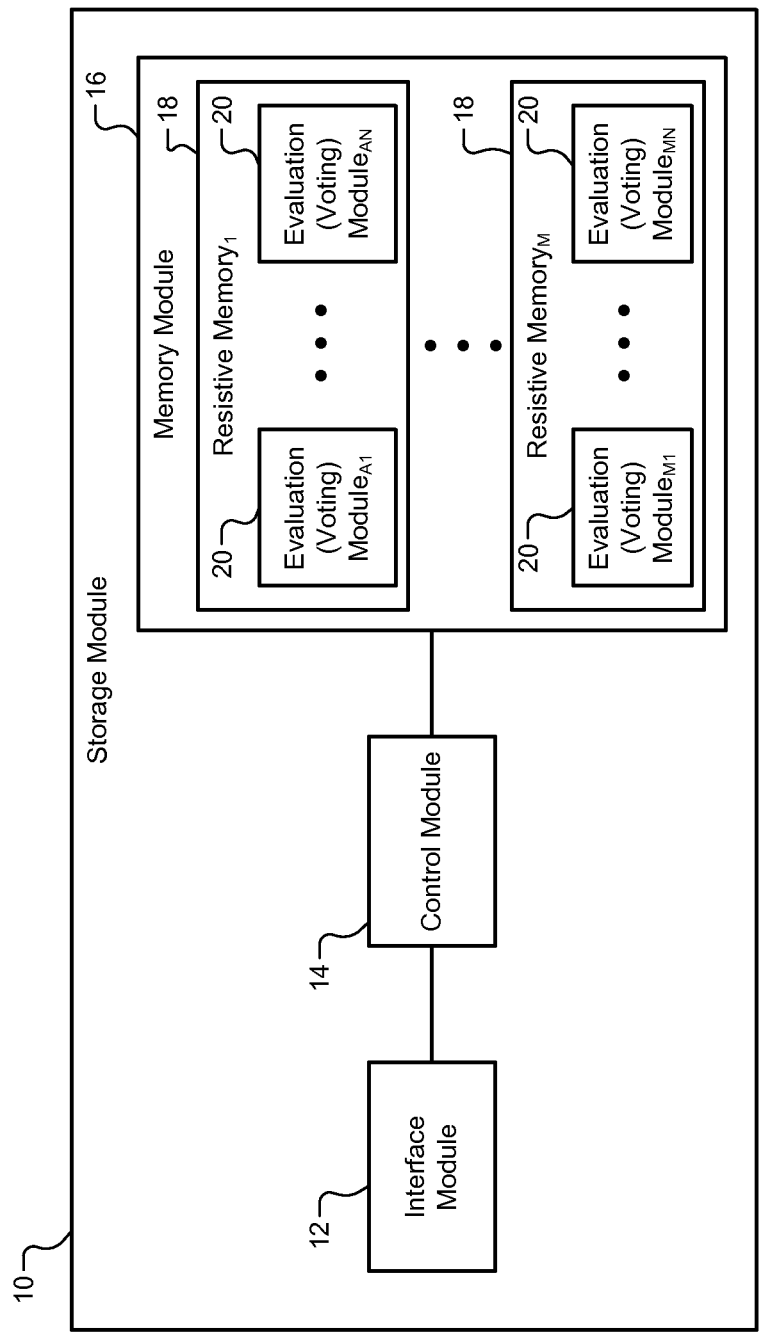
FIG. 1 is a functional block diagram of a storage module incorporating resistive memories with respective evaluation (or voting) modules in accordance with the present disclosure.

FIG. 1 shows a storage module 10 that includes an interface module 12, a control module 14, and a memory module 16. The storage module 10 may be a computer, a mobile device, a cellular phone, a storage device, a network device, a storage drive, a flash drive, a memory card, a memory stick, an integrated circuit, or other device or circuit element that includes resistive memory. The interface module 12 may directly connect to, connect via one or more intervening devices to, and/or communicate with a host computer, a central processing unit of a host computer, a network (e.g., a local area network and an Internet), and/or other circuit elements and/or network devices. The control module 14 may control transfer of data between the interface module 12 and the memory module 16. The control module 14 may control operation of the memory module 16 and/or one or more of the modules of the memory module 16.

The memory module 16 may include one or more resistive memories 18. Each of the resistive memories 18 may be, for example, an integrated circuit or memory chip and include resistive memory cells (shown in FIGS. 2-3). Each of the resistive memories 18 may include one or more evaluation modules 20, which may be referred to as voting modules. The evaluation modules 20 evaluate outputs of sense amplifiers (shown in FIGS. 2-3), which are in the resistive memories 18. This is described in further detail below with respect to FIGS. 2-4.

Figure 2:
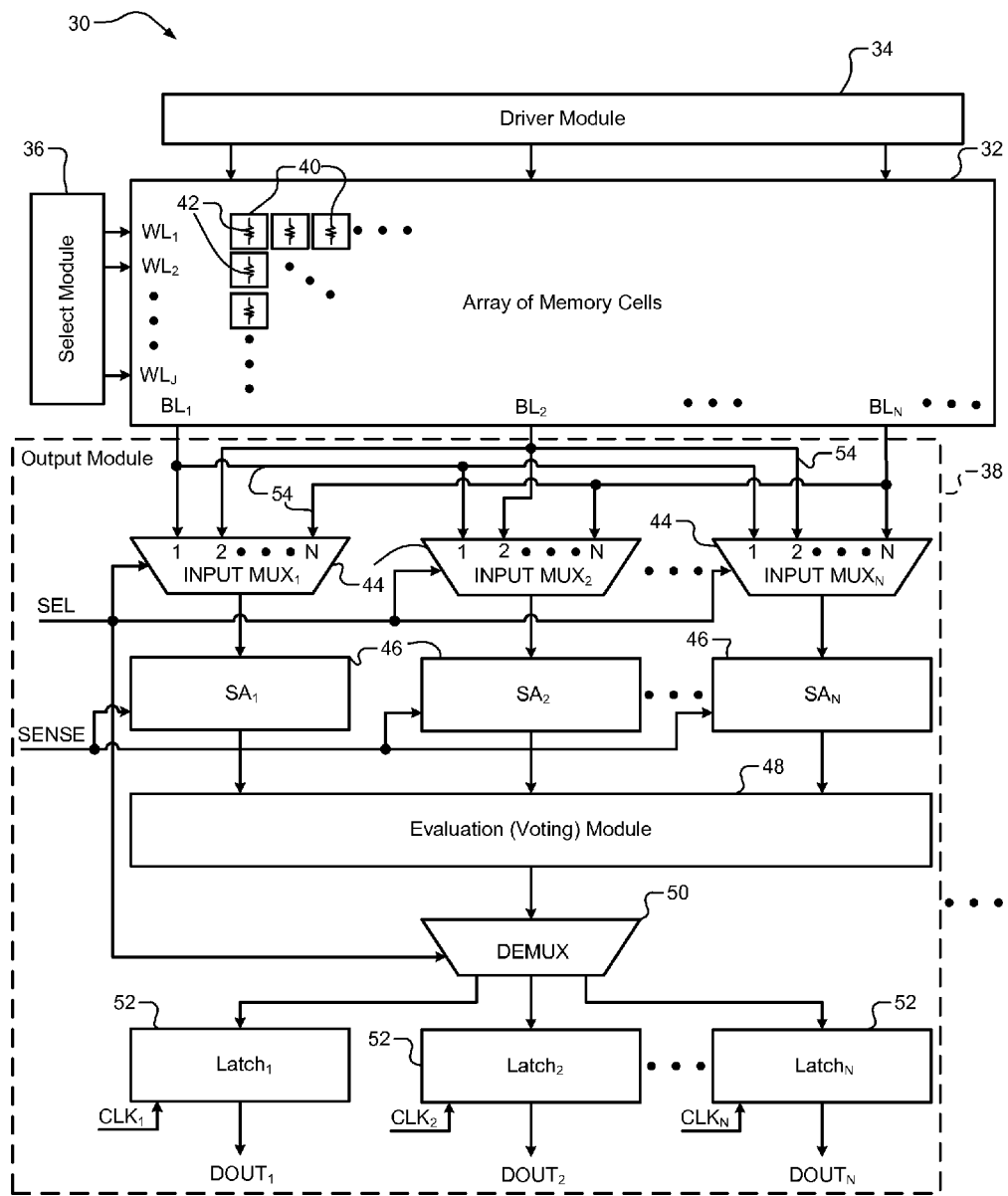
FIG. 2 is a functional block diagram of a nonvolatile memory circuit incorporating an evaluation module in accordance with the present disclosure.

Referring now also to FIG. 2, which shows a nonvolatile memory circuit 30. The nonvolatile memory circuit 30 may be included in any one of the resistive memories 18 of FIG. 1. The nonvolatile memory circuit 30 includes an array 32, a driver module 34, a select module 36, and one or more output modules (one output module 38 is shown). The array 32 may include rows and columns of memory cells 40 that are selected via respective word lines $WL_{1-J}$ and bit lines $BL_{1-I}$. The memory cells 40 may include resistances 42 to which a voltage and/or a current may be applied via the driver module 34. The voltage and/or current may be applied to select and/or enable one or more of the bit lines $BL_{1-I}$ and/or to read one or more of the memory cells 40. Voltages across and/or currents through each of the resistances 42 may be detected to determine resistive states of the resistances 42. This may be done via the output module. The select module 36 may be used to select the word lines $WL_{1-J}$.

The output module 38 includes input multiplexers 44, sense amplifiers 46, one or more evaluation modules (one evaluation module 48 is shown), a demultiplexer 50, and latches 52. The output module 38 may include three or more input multiplexers 44. Each of the input multiplexers 44 includes multiple inputs (identified as inputs 1-N) that receive outputs of respective ones of the bit lines $BL_{1-N}$, where N is an integer greater than or equal to three. The number of input multiplexers 44 may be equal to or different than the number of inputs of each of the input multiplexers 44. Adjacent and/or non-adjacent input multiplexers may receive some or all of the same outputs of the bit lines $BL_{1-N}$. A first input multiplexer may be adjacent to a second input multiplexer if the first input multiplexer is successively before or after the second input multiplexer. Each of the input multiplexers 44 receives the outputs of bit line $BL_{1-N}$, where N may be an integer greater than or equal to 3. In one implementation, the value of N is an odd number. In another implementation, the value of N is equal to 3.

Each of the input multiplexers 44 may receive outputs from any number of the same bit lines. By providing the same outputs of multiple bit lines to successive and/or adjacent input multiplexers, lengths of conductors (e.g., conductors 54) between the bit lines $BL_{1-N}$ and the input multiplexers 44 are minimized.

The input multiplexers 44 select bit lines based on a selection signal SEL, which may be received, for example, from the control module 14. Alternatively, the selection signal SEL may be generated by the memory module 16, a module in the memory module 16, and/or a module in a corresponding resistive memory (e.g., one of the resistive memories 18).

The sense amplifiers 46 receive respective outputs of the input multiplexers 44. The number of sense amplifiers 46 may be equal to or different than the number of inputs of each of the input multiplexers 44 and/or the number of input multiplexers 44. If the same number of sense amplifiers 46 is provided as the number of input multiplexers 44, then each of the sense amplifiers 46 may be dedicated to one of the input multiplexers 44. The sense amplifiers 46 are used to detect the voltages across and/or the currents through the resistances of selected memory cells associated with the bit lines $BL_{1-N}$.

The sense amplifiers 46 amplify the received outputs of the input multiplexers 44 based on one or more detect control signals (one detect control signal SENSE is shown). Each of the sense amplifiers 46 may receive the same detect control signal or separate detect control signals. The one or more detect control signals may be generated by the control module 14, the memory module 16, a module in the memory module 16, and/or a module in a corresponding resistive memory (e.g., one of the resistive memories 18).

The evaluation module 48 receives the outputs of the sense amplifiers 46. In one implementation, the evaluation module 48 determines whether a predetermined number of the outputs of the sense amplifiers 46 have a same state. In another implementation, the evaluation module 48 determines that a majority (or more than 50%) of the outputs of the sense amplifiers 46 have a same state. The evaluation module 48 outputs the state of the predetermined number or majority of the outputs of the sense amplifiers 46.

In one embodiment, the number of inputs on each of the input multiplexers 44, the number of input multiplexers 44, and the number of sense amplifiers 46 is an odd number. This allows a determination of whether a majority of the sense amplifiers have a same output state. If the majority of sense amplifiers have the same output state, the same output state may then be selected.

If the number of sense amplifiers is even, the minimum number of sense amplifiers is four. In this case, a majority rule is applied. If a majority of the sense amplifiers are in a same state, then the majority state is selected. If the number of sense amplifiers having a first state is the same as the number of sense amplifiers having a second state, where the second state is opposite the first state, then the chip is considered a reject and is not used.

The demultiplexer 50 provides the selected state to one of the latches 52 based on the selection signal SEL. For example, if the selection signal SEL selects the first bit line $BL_1$, the selected state is provided to the first latch $Latch_1$. The number of the latches 52 may match or be different than: the number of the inputs on each of the input multiplexers 44; the number of the input multiplexers 44; and the number of the sense amplifiers 46. The latches 52 store and provide selected states received from the demultiplexer 50 as outputs $DOUT_{1-N}$ based on respective clock signals $CLK_{1-N}$. The clock signals $CLK_{1-N}$ may be generated by the control module 14, the memory module 16, a module in the memory module 16, and/or a module in a corresponding resistive memory (e.g., one of the resistive memories 18).

Figure 3:
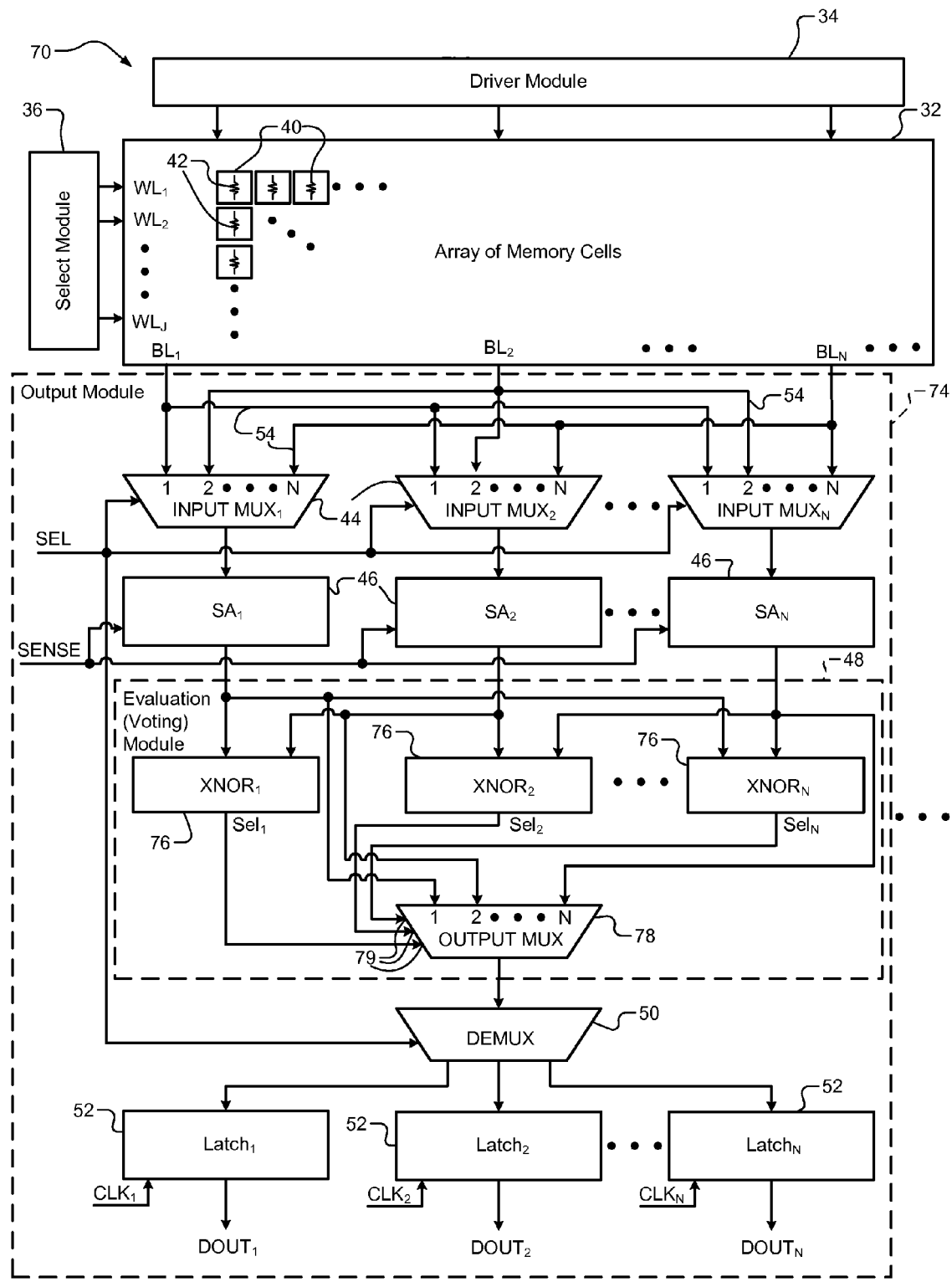
FIG. 3 is a functional block diagram of a nonvolatile memory circuit illustrating elements of an evaluation module in accordance with the present disclosure.

Referring now to FIGS. 1 and 3, in which a nonvolatile memory circuit 70 illustrating elements of an evaluation module 72 is shown. The evaluation module 72 is provided as an example. Although the evaluation module 72 is shown as having certain circuit elements, the evaluation module 72 may include additional or other suitable circuit elements. The nonvolatile memory circuit 70 may be included in any one of the nonvolatile memories of FIG. 1.

The nonvolatile memory circuit 70 includes the array 32, the driver module 34, the select module 36, and an output module 74. The memory cells 40 in the array 32 may include the resistances 42 to which a voltage and/or a current may be applied via the driver module 34. The voltage and/or current may be applied to select and/or enable one or more of the bit lines $BL_{1-J}$ and/or to read one or more of the memory cells 40.

Voltages across and/or currents through each of the resistances 42 may be detected to determine resistive states of the resistances. This may be done via the output module 74. The select module 36 may be used to select the word lines of the array of memory cells 32.

The output module 74 includes the input multiplexers 44, the sense amplifiers 46, one or more evaluation modules (one evaluation module 72 is shown), the demultiplexer 50, and the latches 52. The output module 74 may include three or more input multiplexers. Any number of input multiplexers may be included. The inputs of each of the input multiplexers 44 receive outputs of respective ones of the bit lines $BL_{1-N}$, where N may be an integer greater than or equal to three. The number of input multiplexers 44 may be equal to or different than the number of inputs of each of the input multiplexers 44. Adjacent and/or non-adjacent input multiplexers may receive some or all of the same outputs of the bit lines $BL_{1-N}$.

Each of the input multiplexers 44 may receive the outputs of the bit lines $BL_{1-N}$. In one implementation, the value of N is an odd number. In another implementation, the value of N is equal to 3. Each of the input multiplexers 44 may receive outputs from any number of the same bit lines. The input multiplexers 44 select bit lines based on the selection signal SEL.

The sense amplifiers 46 receive respective outputs of the input multiplexers 44. The number of sense amplifiers 46 may be equal to or different than the number of inputs of each of the input multiplexers 44 and/or the number of the input multiplexers 44. If the same number of the sense amplifiers 46 is provided as the number of the input multiplexers 44, then each of the sense amplifiers 46 may be dedicated to one of the input multiplexers 44. The sense amplifiers 46 amplify the received outputs of the input multiplexers 44 based on the one or more detect control signals (one detect control signal SENSE is shown). Each of the sense amplifiers 46 may receive the same detect control signal or separate detect control signals.

In the example implementation shown, the evaluation module 72 includes logic gates 76, such as exclusive NOR (XNOR) gates, and an output multiplexer 78. The XNOR gates provide the inverse of exclusive OR (XOR) gates. Each of the logic (or XNOR) gates 76 indicates whether outputs of corresponding sense amplifiers are in a same state and provides a respective one of the outputs $Sel_{1-N}$. For example, the first logic (or XNOR) gate $XNOR_1$ indicates whether the outputs of the first sense amplifier $SA_1$ and the second sense amplifier $SA_2$ are the same. An output from the first logic gate of '1' indicates that the states of the outputs of the first sense amplifier $SA_1$ and the second sense amplifier $SA_2$ are the same. An output from the first logic gate of '0' indicates that the states of the outputs of the first sense amplifier $SA_1$ and the second sense amplifier $SA_2$ are different. As an alternative, each of the logic gates 76 may be replaced with one or more logic gates and/or other suitable circuit elements.

The output multiplexer 78 receives (i) the outputs $Sel_{1-N}$ of the logic gates 76 at selection control inputs 79 of the output multiplexer 78, and (ii) the outputs $Sel_{1-N}$ of the sense amplifiers 46 at amplifier inputs, identified as inputs 1-N on the output multiplexer 78. The output multiplexer 78 selects one of the outputs of the sense amplifiers based on one or more of the outputs $Sel_{1-N}$ of the logic gates 76. The outputs $Sel_{1-N}$ of the sense amplifiers 46 control output of the multiplexer 78 In one implementation, the number of the sense amplifiers 46 and the number of the logic gates 76 is three. In this implementation, any pair of outputs signals of the sense amplifiers 46 that have a same state (or value) results in a HIGH output on a corresponding of the logic gates 76. The output multiplexer 78 may provide a selected (or majority) state for any number of HIGH states on the selection control inputs 79 of the output multiplexer 78. The output of the output multiplexer 78 is provided to the demultiplexer 50.

The demultiplexer 50 provides the selected state to one of the latches 52 based on the selection signal SEL. For example, if the selection signal SEL selects the first bit line, the selected state is provided to the first latch Latch$_1$. The number of the latches 52 may match or be different than: the number of the inputs on each of the input multiplexers 44; the number of the input multiplexers 44; and the number of the sense amplifiers 46. The latches 52 store and provide selected states received from the demultiplexer 50 as the outputs DOUT$_{1-N}$ based on the respective clock signals CLK$_{1-N}$.

Figure 4:
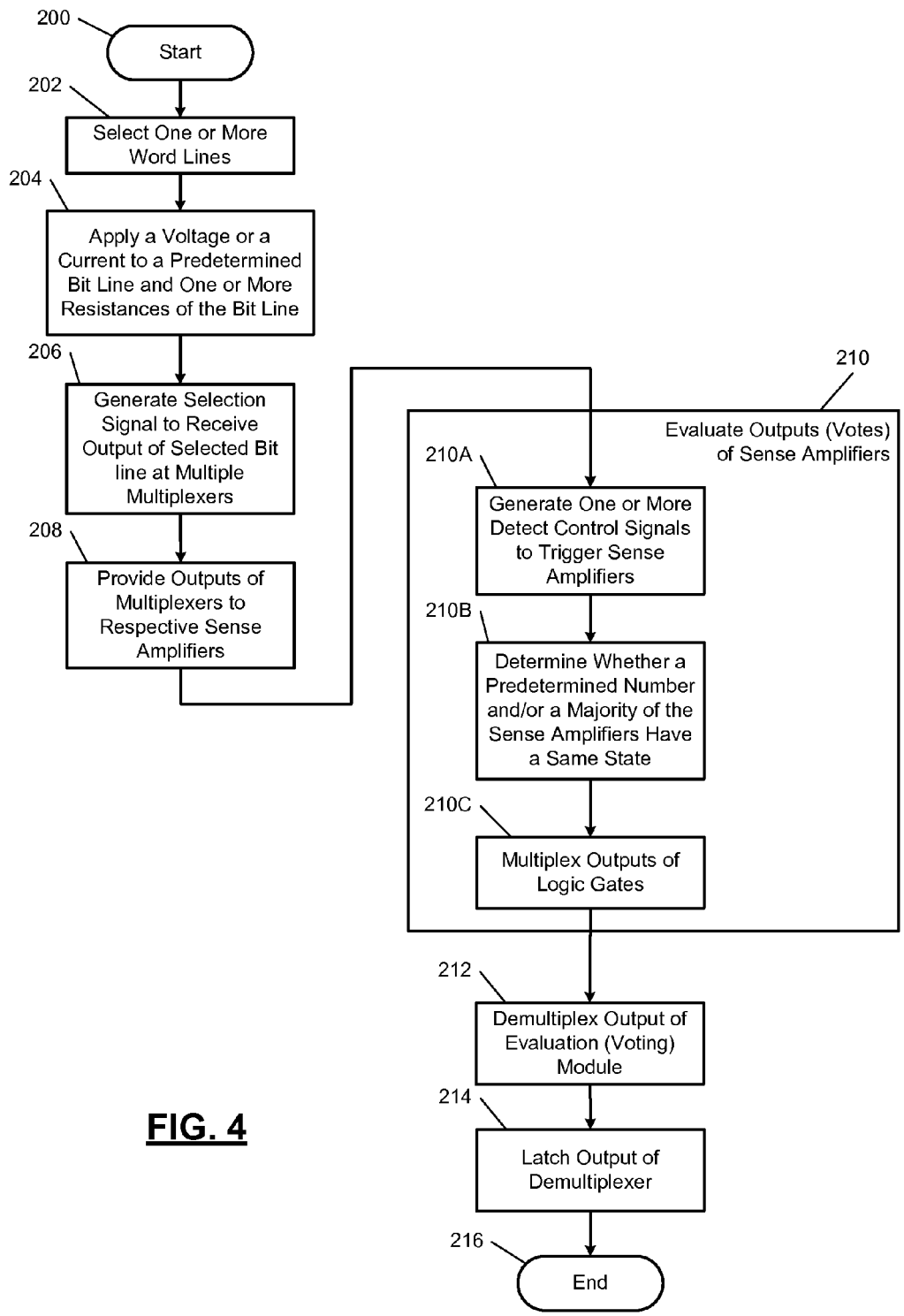
FIG. 4 illustrates a method of operating a nonvolatile memory circuit in accordance with the present disclosure.

The nonvolatile memory circuits disclosed herein (e.g., the nonvolatile memory circuits 30, 70 of FIGS. 2-3) may be operated using numerous methods, an example method is illustrated in FIG. 4. Although the following tasks are primarily described with respect to the implementations of FIGS. 1-3, the tasks may be easily modified to apply to other implementations of the present disclosure. Although the tasks are described with respect to a single bit line and associated input multiplexers, sense amplifiers, an evaluation module, logic gates, and/or an output multiplexer, the tasks may be iteratively performed for other bit lines and associated input multiplexers, sense amplifiers, evaluation modules, logic gates, and/or output multiplexers.

The method may begin at 200. At 202, the select module 36 may select one of the word lines. The control module 14, the memory module 16, and/or one of the other modules in the memory module 16 may control the selection of the one or more word lines.

At 204, the driver module 34 applies a voltage or a current to a predetermined and/or selected bit line and to one or more resistances of the bit line. The control module 14, the memory module 16, and/or one of the other modules in the memory module 16 may control selection of the bit line and the one or more resistances of the bit line.

At 206, one or more selection signals (e.g., the selection signal SEL) are generated as described above to select inputs of respective input multiplexers (e.g., inputs of the input multiplexers 44) receiving the output of the bit line. At 208, the input multiplexers output the selected inputs to respective sense amplifiers (e.g., the sense amplifiers 46).

At 210, an evaluation module (e.g., one of the evaluation modules 48, 72) evaluates the outputs (or votes) of the sense amplifiers to determine whether a predetermined number and/or a majority of the outputs of the sense amplifiers have a same state. The evaluation module outputs the state of the predetermined number or majority of the outputs of the sense amplifiers. This provides improved read accuracy of a bit line.

At 210A, the sense amplifiers corresponding to the input multiplexers are triggered to receive (i.e. read) and amplify the outputs of the input multiplexers. One or more detect control signals may be generated as described above to enable the sense amplifiers.

At 210B, logic gates (e.g., the logic gates 76) of the evaluation module may receive corresponding outputs of two or more of the sense amplifiers and indicate whether the two or more of the outputs of the sense amplifiers are in a same state. This may include performing an XNOR operation on the corresponding outputs of two or more of the sense amplifiers.

At 210C, an output multiplexer (e.g., the output multiplexer 78) of the evaluation module may select one of the outputs (the selected output) of the sense amplifiers based on one or more of the outputs of the logic gates. For example, if one of the outputs of the logic gates is in a HIGH state, either one of the two corresponding outputs of the sense amplifiers of that logic gate (i.e. the state of the inputs of that logic gate) may be provided as an output to the demultiplexer 50.

By selecting the same state of the predetermined number and/or majority of the outputs of the sense amplifiers, an output of a sense amplifier that is different (i.e. does not match the state of the predetermined number and/or majority of the outputs of the sense amplifiers) is not utilized. The sense amplifier that has a different output (referred to as the outlier sense amplifier) may have too high of an offset voltage and/or may have a defect. This improves overall sensitivity associated with the sense amplifiers while repairing resistive memories having one or more failed sense amplifiers.

Effective offset voltages of the sense amplifiers are reduced, which increases the overall sensitivity of the sense amplifiers. Since the output (or outlier value) of a sense amplifier of a group of sense amplifiers monitoring a same bit line is not used, the effective offset voltage of the group of sense amplifiers may be equal to the highest offset voltage of the sense amplifiers having the same output state. The highest offset voltage of the sense amplifiers having the same output state may be less than the offset voltage of the sense amplifier having the output with the outlier value. This results in an effective offset voltage for the group of sense amplifiers that is reduced.

At 212, the demultiplexer 50 provides the selected output provided by the evaluation module and/or the output multiplexer to one of the latches 52 based on the selection signal SEL. At 214, the latch receiving the selected output provides the selected output as an output of the output module based on a corresponding clock signal. The clock signal causes the latch to latch the selected state and provide the selected state for the respective bit line as an output. The method may end at 216.

The above-described tasks are meant to be illustrative examples; the tasks may be performed sequentially, synchronously, simultaneously, continuously, during overlapping time periods or in a different order depending upon the application. Also, any of the tasks may not be performed or skipped depending on the implementation and/or sequence of events.

For example, tasks performed at one or more of 206-210 may be performed in parallel or sequentially. As an example, the inputs of the input multiplexers may select the outputs of the bit lines in parallel and during a same period of time when the input multiplexers receive the same selection signal. Alternatively, the input multiplexers may select the outputs of the bit lines sequentially based on respective selection signals and/or respective assigned pulses, frequencies, amplitudes, etc. of a single selection signal.

As another example, the sense amplifiers may be enabled in parallel and during a same period of time, for example, when the sense amplifiers receive the same detect control signal. Alternatively, the sense amplifiers may be enabled sequentially based on respective detect control signals and/or respective assigned pulses, frequencies, amplitudes, etc. of a single detect control signal.

As yet another example, the first multiplexer may be enabled, followed by the first sense amplifier and an output of the first sense amplifier is provided to the evaluation module. The evaluation module stores the output of the first sense amplifier as a first sample (or vote). Subsequently, the second multiplexer is enabled, followed by the second sense amplifier and an output of the second sense amplifier is provided to the evaluation module. The evaluation module stores the output of the second sense amplifier as a second sample. This process may be iteratively continued until samples are collected for each of the sense amplifiers receiving an output of a same bit line. The output values of the sense amplifiers may be stored in the evaluation module and/or a corresponding nonvolatile memory, a resistive memory (e.g., the array 32 of memory cells 40), the memory module, the control module, and/or the storage module. The evaluation module may then compare the stored values (i.e. the collected samples) and indicate a selected state as described above. The selected state may be the same as a state of a predetermined number and/or a majority of the outputs of the sense amplifiers. This process may be continued for additional bit lines.

Although the terms first, second, third, etc. may be used herein to describe various multiplexers, sense amplifiers, latches, outputs, states, elements, and/or components, these items should not be limited by these terms. These terms may only be used to distinguish one item from another item. Terms such as "first," "second," and other numerical terms when used herein do not imply a sequence or order unless clearly indicated by the context. Thus, a first item discussed below could be termed a second item without departing from the teachings of the example implementations.

Various terms are used herein to describe the physical relationship between elements. When a first element is referred to as being "on", "engaged to", "connected to", or "coupled to" a second element, the first element may be directly on, engaged, connected, disposed, applied, or coupled to the second element, or intervening elements may be present. In contrast, when an element is referred to as being "directly on", "directly engaged to", "directly connected to", or "directly coupled to" another element, there may be no intervening elements present. Other words used to describe the relationship between elements should be interpreted in a like fashion (e.g., "between" versus "directly between", "adjacent" versus "directly adjacent", etc.).

The wireless communications described in the present disclosure can be conducted in full or partial compliance with IEEE standard 802.11-2012, IEEE standard 802.16-2009, IEEE standard 802.20-2008, and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2012 may be supplemented by draft IEEE standard 802.11ac, draft IEEE standard 802.11ad, and/or draft IEEE standard 802.11ah.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A memory comprising:
a module configured to
monitor outputs of a plurality of sense amplifiers, wherein each of the outputs of the plurality of sense amplifiers is configured to be in a first state or a second state,
determine that a plurality of the outputs of the plurality of sense amplifiers are in a same state, wherein the same state is the first state or the second state, and
output the same state of the plurality of the outputs of the plurality of sense amplifiers; and
a demultiplexer configured to provide the same state of the plurality of the outputs of the plurality of sense amplifiers to a latch.

2. The memory of claim 1, wherein:
the module is configured to determine that a majority of the outputs of the plurality of sense amplifiers is in the same state; and
the demultiplexer is configured to provide the same state of the majority of the outputs of the plurality of sense amplifiers to the latch.

3. The memory of claim 1, further comprising:
an array of memory cells comprising a plurality of bit lines;
a plurality of multiplexers, wherein each of the plurality of multiplexers is configured to receive outputs from two or more of the plurality of bit lines; and
the plurality of sense amplifiers configured to amplify respective outputs of the plurality of multiplexers.

4. The memory of claim 3, further comprising a second module configured to generate one or more selection signals, wherein:
the plurality of multiplexers are configured to select the plurality of bit lines based on the one or more selection signals; and
the demultiplexer is configured to, based on the one or more selection signals, select the latch from a plurality of latches, and provide the same state of the plurality of the outputs of the plurality of sense amplifiers to the selected latch.

5. The memory of claim 3, wherein the module comprises:
a plurality of logic gates configured to receive a respective one of the outputs of the plurality of sense amplifiers; and
an output multiplexer configured to, based on the outputs of the plurality of sense amplifiers, select an output of the plurality of logic gates.

6. The memory of claim 5, wherein the plurality of logic gates are exclusive NOR gates.

7. The memory of claim 5, wherein the output multiplexer is configured to receive the outputs of the plurality of sense amplifiers, and based on the outputs of the plurality of sense amplifiers, output the same state of the plurality of the outputs of the plurality of sense amplifiers to the latch.

8. The memory of claim 5, further comprising:
a second module configured to generate a selection signal; and
a plurality of latches,
wherein the demultiplexer is configured to, based on the selection signal, select one of the plurality of latches, and provide an output of the output multiplexer to the selected one of the plurality of latches.

9. The memory of claim 5, further comprising a second module configured to generate one or more control signals,
wherein each of the plurality of sense amplifiers is configured to, based on the one or more control signals, output an amplified version of the respective output of the plurality of multiplexers.

10. The memory of claim 9, wherein:
voltages across or currents through the memory cells are indicative of resistive states of resistances of the memory cells; and
each of the resistances is configured to be in the first state or the second state.

11. An integrated circuit comprising a plurality of the memory of claim 9, wherein the array of memory cells includes at least one of phase-change random access memory cells, resistive random access memory cells, and magnetic random access memory cells.

12. A method comprising:
monitoring outputs of a plurality of sense amplifiers, wherein each of the outputs of the plurality of sense amplifiers is configured to be in a first state or a second state;
determining that a plurality of the outputs of the plurality of sense amplifiers are in a same state, wherein the same state is the first state or the second state;
outputting the same state of the plurality of the outputs of the plurality of sense amplifiers; and
providing the same state of the plurality of the outputs of the plurality of sense amplifiers to a latch.

13. The method of claim 12, further comprising:
determining that a majority of the outputs of the plurality of sense amplifiers is in the same state; and
providing the same state of the majority of the outputs of the plurality of sense amplifiers to the latch.

14. The method of claim 12, further comprising:
receiving at each of a plurality of multiplexers outputs from two or more of a plurality of bit lines of an array of memory cells; and
amplifying via the plurality of sense amplifiers a respective output of the plurality of multiplexers.

15. The method of claim 14, further comprising:
generating one or more selection signals;
based on the one or more selection signals, selecting via the plurality of multiplexers the plurality of bit lines;
based on the one or more selection signals, selecting the latch from a plurality of latches; and
providing the same state of the plurality of the outputs of the plurality of sense amplifiers to the selected latch.

16. The method of claim 14, further comprising:
receiving at a plurality of logic gates a respective one of the outputs of the plurality of sense amplifiers; and
based on the outputs of the plurality of sense amplifiers, select an output of the plurality of logic gates.

17. The method of claim 16, wherein the plurality of logic gates are exclusive NOR gates.

18. The method of claim 16, further comprising:
receiving the outputs of the plurality of sense amplifiers; and
based on the outputs of the plurality of sense amplifiers, outputting the same state of the plurality of the outputs of the plurality of sense amplifiers to the latch.

19. The method of claim 16, further comprising:
generating a selection signal; and
based on the selection signal,
selecting one of a plurality of latches, and
providing an output of the output multiplexer to the selected one of the plurality of latches.

20. The method of claim 16, further comprising:
generating one or more control signals; and
based on the one or more control signals, outputting from each of the plurality of sense amplifiers an amplified version of the respective output of the plurality of multiplexers.

21. The method of claim 20, wherein:
voltages across or currents through the memory cells are indicative of resistive states of resistances of the memory cells; and
each of the resistances is configured to be in the first state or the second state.

22. The method of claim 20, wherein the array of memory cells includes phase-change random access memory cells, resistive random access memory cells, and magnetic random access memory cells.

* * * * *